(12) United States Patent
Wormsbecher et al.

(10) Patent No.: US 9,583,851 B2
(45) Date of Patent: Feb. 28, 2017

(54) ORTHOGONAL CARD EDGE CONNECTOR

(71) Applicant: Lenovo Enterprise Solutions (Singapore) Pte. Ltd., Singapore (SG)

(72) Inventors: Paul Andrew Wormsbecher, Morrisville, NC (US); Tony C. Sass, Fuquay Varina, NC (US); Derek Ian Schmidt, Raleigh, NC (US); Jonathan Randall Hinkle, Morrisville, NC (US)

(73) Assignee: Lenovo Enterprise Solutions (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 14/737,430

(22) Filed: Jun. 11, 2015

(65) Prior Publication Data
US 2016/0365654 A1    Dec. 15, 2016

(51) Int. Cl.
*H01R 12/00*    (2006.01)
*H01R 12/70*    (2011.01)
*H01R 12/72*    (2011.01)

(52) U.S. Cl.
CPC ....... *H01R 12/7076* (2013.01); *H01R 12/721* (2013.01)

(58) Field of Classification Search
CPC ............ H01R 13/514; H01R 13/65807; H01R 23/7068; H01R 23/7005; H01R 23/684; H01R 23/70; H01R 23/688; H01R 23/7073; H01R 23/005; H05K 1/117
USPC ......... 439/59, 607.05–607.15, 607.31–607.4
See application file for complete search history.

(56) References Cited

U.S. PATENT DOCUMENTS

| | | | | | |
|---|---|---|---|---|---|
| 3,530,422 | A | * | 9/1970 | Goodman | H01R 12/585 29/845 |
| 3,993,936 | A | * | 11/1976 | Meade | H01R 12/721 361/778 |
| 4,013,928 | A | * | 3/1977 | Sarinopoulos | H05K 7/1425 211/41.17 |
| 4,353,614 | A | * | 10/1982 | Etchison, Jr. | H01R 23/68 361/802 |
| 4,603,375 | A | * | 7/1986 | Miller | H05K 7/1409 361/754 |
| 4,790,760 | A | * | 12/1988 | Kreinberg | H01R 12/7088 439/55 |
| 4,790,762 | A | * | 12/1988 | Harms | H05K 7/1478 439/59 |
| 5,224,019 | A | * | 6/1993 | Wong | G06F 1/184 361/679.32 |

(Continued)

OTHER PUBLICATIONS

Molex, "Impel Backplane Connector and Cable Assembly System," Molex, Backplane Products Webpage, retrieved from http://www.molex.com/molex/products/family?key=impel_backplane_connector_system&channel=products&chanName=family&pageTitle=Introduction, 2015, 2 pages.

*Primary Examiner* — Abdullah Riyami
*Assistant Examiner* — Vladimir Imas
(74) *Attorney, Agent, or Firm* — Zilka-Kotab, PC

(57) ABSTRACT

A system, according to one embodiment, includes a first end having several first contacts configured for coupling with a circuit board, a second end oriented about orthogonal to the first end, and a plurality of leads connecting the first and second contacts. The second end has a plurality of second contacts configured for coupling directly with a card edge of an electronic device. The orientation of the second end relative to the first end is fixed. A system, according to another embodiment, includes a circuit board, a plurality of such connectors.

18 Claims, 7 Drawing Sheets

(56) References Cited

U.S. PATENT DOCUMENTS

| | | | | |
|---|---|---|---|---|
| 5,276,817 | A * | 1/1994 | Matschke | H01R 12/79 361/679.4 |
| 5,290,174 | A * | 3/1994 | Woratyla | G06K 7/0047 439/377 |
| 5,706,179 | A * | 1/1998 | Palatov | G06F 1/18 361/726 |
| 5,795,172 | A * | 8/1998 | Shahriari | G01R 31/2808 439/260 |
| 6,325,472 | B1 * | 12/2001 | Tirrell | H05K 7/1424 312/111 |
| 6,328,605 | B1 * | 12/2001 | Walker | H01R 12/52 439/59 |
| 6,363,450 | B1 * | 3/2002 | Lash | G06F 1/184 361/748 |
| 6,390,857 | B1 * | 5/2002 | Pickles | H01R 13/514 439/680 |
| 6,411,506 | B1 * | 6/2002 | Hipp | G06F 1/189 174/261 |
| 6,606,248 | B2 * | 8/2003 | Matthews | H05K 13/0069 206/708 |
| 6,666,705 | B1 * | 12/2003 | Lauruhn | H01R 12/721 439/377 |
| 6,811,440 | B1 * | 11/2004 | Rothermel | H01R 12/7088 439/79 |
| 6,863,572 | B1 * | 3/2005 | Yi | H01R 12/721 439/59 |
| 6,997,736 | B2 * | 2/2006 | Costello | H01R 9/096 439/378 |
| 7,044,794 | B2 * | 5/2006 | Consoli | H01R 13/6485 439/607.07 |
| 7,168,988 | B1 * | 1/2007 | Rothermel | H01R 13/6625 439/108 |
| 7,255,578 | B2 * | 8/2007 | Campini | H05K 7/1461 439/79 |
| 7,277,296 | B2 * | 10/2007 | Ice | H05K 7/1418 361/679.41 |
| 7,497,736 | B2 * | 3/2009 | Minich | H01R 24/30 439/607.05 |
| 7,585,186 | B2 * | 9/2009 | McAlonis | H01R 13/514 439/607.05 |
| 7,993,147 | B2 * | 8/2011 | Cole | H01R 13/514 439/607.39 |
| 8,043,097 | B2 * | 10/2011 | Ngo | H01R 12/7088 439/206 |
| 8,182,289 | B2 * | 5/2012 | Stokoe | H01R 23/688 439/607.07 |
| 8,241,067 | B2 * | 8/2012 | Girard, Jr. | H01R 13/6466 439/620.21 |
| 8,465,302 | B2 * | 6/2013 | Regnier | H01R 9/038 439/108 |
| 8,550,861 | B2 * | 10/2013 | Cohen | H01R 12/58 439/607.05 |
| 8,585,427 | B2 * | 11/2013 | Ukawa | H01R 13/627 439/377 |
| 8,690,589 | B2 * | 4/2014 | Ngo | H01R 12/7052 439/630 |
| 8,696,389 | B2 * | 4/2014 | Mason | H01R 12/716 439/637 |
| 8,740,643 | B2 * | 6/2014 | Kuang | H01R 12/721 439/541.5 |
| 8,747,133 | B2 * | 6/2014 | Shen | H01R 12/7005 439/157 |
| 8,771,001 | B2 * | 7/2014 | Li | H01R 13/639 439/160 |
| 8,851,916 | B2 * | 10/2014 | Chen | H01R 13/6275 439/327 |
| 8,864,521 | B2 * | 10/2014 | Atkinson | H01R 13/6471 439/607.07 |
| 8,920,194 | B2 * | 12/2014 | Minich | H01R 13/6471 439/607.05 |
| 9,022,806 | B2 * | 5/2015 | Cartier, Jr. | H01R 12/712 439/607.07 |

* cited by examiner

ORTHOGONAL CARD EDGE CONNECTOR

FIELD OF THE INVENTION

The present invention relates to electrical connectors, and more particularly, this invention relates to orthogonal card to circuit board electrical connectors.

BACKGROUND

Conventional card edge connection layouts may include condensed vertical backplane connections. Vertical backplane connection layouts may be perpendicular to the airflow through the card environment, e.g., such as a high performance card in a computer, etc., which may be disruptive to normal functionality e.g. due to overheating, etc. These conventional card environments may further lack hot swap accessibility due to condensed layout designs of vertical backplane connections. Again this may prove disruptive to normal functionality due to complications involved in swapping out the vertical backplane components e.g. swapping due to a non-functional component, swapping due to increased functionality demands, etc.

Embodiments described herein establish advantageous orthogonal card edge connection layouts while maintaining a condensed and temperature balanced card environment.

SUMMARY

A system, according to one embodiment, includes a first end having a plurality of first contacts configured for coupling with a circuit board, a second end oriented about orthogonal to the first end, and a plurality of leads connecting the first contacts to the second contacts. The second end has a plurality of second contacts configured for coupling directly with a card edge of an electronic device. The orientation of the second end relative to the first end is fixed.

A system, according to another embodiment, includes a circuit board, a plurality of connectors, and a plurality of leads connecting the first contacts to the second contacts. Each connector has a first end having a plurality of first contacts coupled to the circuit board, and a second end oriented about orthogonal to the first end, the second end having a plurality of second contacts configured for coupling directly with a card edge of an electronic device. The orientation of the second end relative to the first end is fixed.

Other aspects and advantages of the present invention will become apparent from the following detailed description, which, when taken in conjunction with the drawings, illustrate by way of example the principles of the invention.

BRIEF DESCRIPTION OF THE DRAWINGS

For a fuller understanding of the nature and advantages of the present invention, as well as the preferred mode of use, reference should be made to the following detailed description read in conjunction with the accompanying drawings.

DETAILED DESCRIPTION

Figure 1:
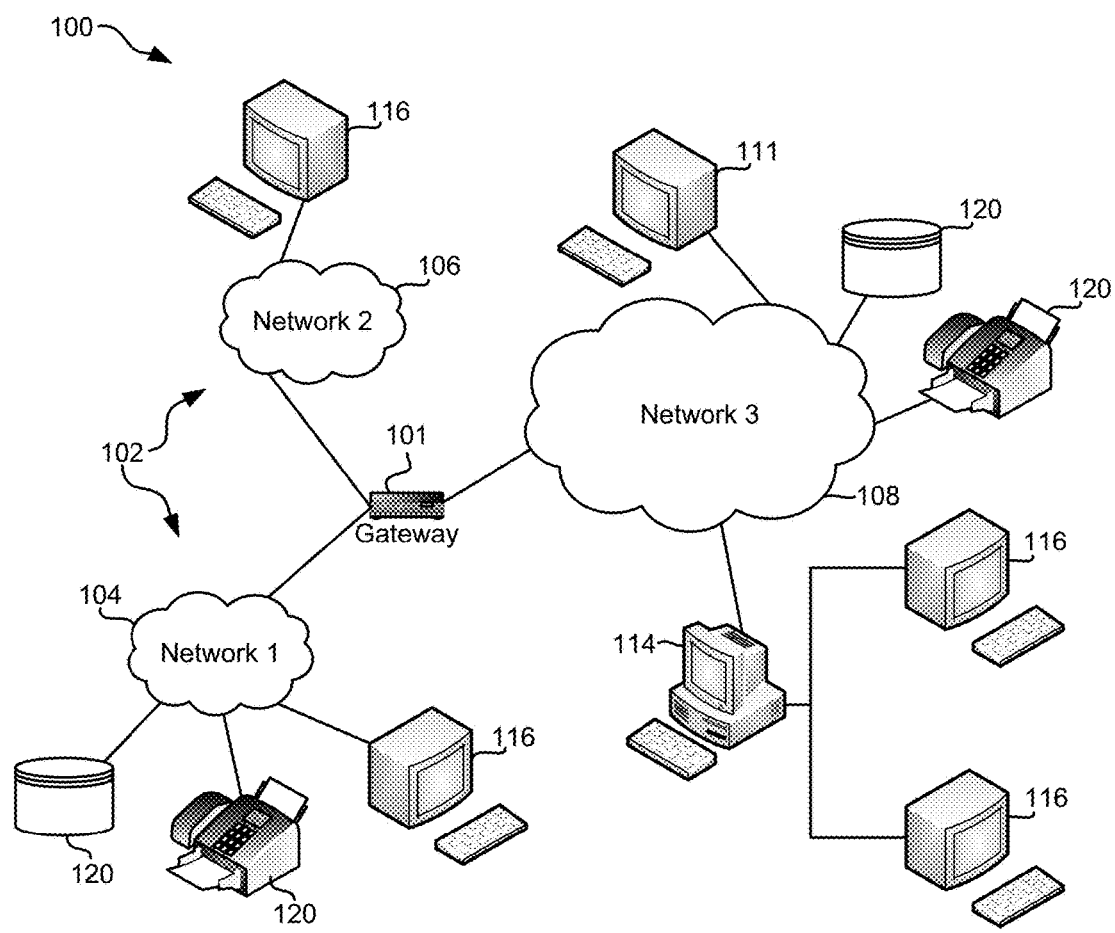
FIG. 1 is a network architecture, in accordance with one embodiment.

The following description is made for the purpose of illustrating the general principles of the present invention and is not meant to limit the inventive concepts claimed herein. Further, particular features described herein can be used in combination with other described features in each of the various possible combinations and permutations.

Unless otherwise specifically defined herein, all terms are to be given their broadest possible interpretation including meanings implied from the specification as well as meanings understood by those skilled in the art and/or as defined in dictionaries, treatises, etc.

It must also be noted that, as used in the specification and the appended claims, the singular forms "a," "an" and "the" include plural referents unless otherwise specified.

The following description discloses several preferred embodiments of orthogonal card to circuit board electrical connections and/or related systems and methods.

In one general embodiment, a system includes a first end having a plurality of first contacts configured for coupling with a circuit board, a second end oriented about orthogonal to the first end, and a plurality of leads connecting the first contacts to the second contacts. The second end has a plurality of second contacts configured for coupling directly with a card edge of an electronic device. The orientation of the second end relative to the first end is fixed.

In another general embodiment, a system includes a circuit board, a plurality of connectors, and a plurality of leads connecting the first contacts to the second contacts. Each connector has a first end having a plurality of first contacts coupled to the circuit board, and a second end oriented about orthogonal to the first end, the second end having a plurality of second contacts configured for coupling directly with a card edge of an electronic device. The orientation of the second end relative to the first end is fixed.

The description herein is presented to enable any person skilled in the art to make and use the invention and is provided in the context of particular applications of the invention and their requirements. Various modifications to the disclosed embodiments will be readily apparent to those skilled in the art and the general principles defined herein may be applied to other embodiments and applications without departing from the spirit and scope of the present invention. Thus, the present invention is not intended to be limited to the embodiments shown, but is to be accorded the widest scope consistent with the principles and features disclosed herein.

In particular, various embodiments of the invention discussed herein are implemented using the Internet as a means of communicating among a plurality of computer systems.

One skilled in the art will recognize that the present invention is not limited to the use of the Internet as a communication medium and that alternative methods of the invention may accommodate the use of a private intranet, a Local Area Network (LAN), a Wide Area Network (WAN) or other means of communication. In addition, various combinations of wired, wireless (e.g., radio frequency) and optical communication links may be utilized.

The program environment in which one embodiment of the invention may be executed illustratively incorporates one or more general-purpose computers or special-purpose devices such hand-held computers. Details of such devices (e.g., processor, memory, data storage, input and output devices) are well known and are omitted for the sake of clarity.

It should also be understood that the techniques of the present invention might be implemented using a variety of technologies. For example, the methods described herein may be implemented in software running on a computer system, or implemented in hardware utilizing one or more processors and logic (hardware and/or software) for performing operations of the method, application specific integrated circuits, programmable logic devices such as Field Programmable Gate Arrays (FPGAs), and/or various combinations thereof. In one illustrative approach, methods described herein may be implemented by a series of computer-executable instructions residing on a storage medium such as a physical (e.g., non-transitory) computer-readable medium. In addition, although specific embodiments of the invention may employ object-oriented software programming concepts, the invention is not so limited and is easily adapted to employ other forms of directing the operation of a computer.

The invention can also be provided in the form of a computer program product comprising a computer readable storage or signal medium having computer code thereon, which may be executed by a computing device (e.g., a processor) and/or system. A computer readable storage medium can include any medium capable of storing computer code thereon for use by a computing device or system, including optical media such as read only and writeable CD and DVD, magnetic memory or medium (e.g., hard disk drive, tape), semiconductor memory (e.g., FLASH memory and other portable memory cards, etc.), firmware encoded in a chip, etc.

A computer readable signal medium is one that does not fit within the aforementioned storage medium class. For example, illustrative computer readable signal media communicate or otherwise transfer transitory signals within a system, between systems e.g., via a physical or virtual network, etc.

FIG. 1 illustrates an architecture 100, in accordance with one embodiment. As an option, the present architecture 100 may be implemented in conjunction with features from any other embodiment listed herein, such as those described with reference to the other FIGS. Of course, however, such architecture 100 and others presented herein may be used in various applications and/or in permutations which may or may not be specifically described in the illustrative embodiments listed herein. Further, the architecture 100 presented herein may be used in any desired environment.

As shown in FIG. 1, a plurality of remote networks 102 are provided including a first remote network 104 and a second remote network 106. A gateway 101 may be coupled between the remote networks 102 and a proximate network 108. In the context of the present network architecture 100, the networks 104, 106 may each take any form including, but not limited to a LAN, a WAN such as the Internet, public switched telephone network (PSTN), internal telephone network, etc.

In use, the gateway 101 serves as an entrance point from the remote networks 102 to the proximate network 108. As such, the gateway 101 may function as a router, which is capable of directing a given packet of data that arrives at the gateway 101, and a switch, which furnishes the actual path in and out of the gateway 101 for a given packet.

Further included is at least one data server 114 coupled to the proximate network 108, and which is accessible from the remote networks 102 via the gateway 101. It should be noted that the data server(s) 114 may include any type of computing device/groupware. Coupled to each data server 114 is a plurality of user devices 116. Such user devices 116 may include a desktop computer, laptop computer, hand-held computer, printer or any other type of logic. It should be noted that a user device 111 may also be directly coupled to any of the networks, in one embodiment.

A peripheral 120 or series of peripherals 120, e.g. facsimile machines, printers, networked storage units, etc., may be coupled to one or more of the networks 104, 106, 108. It should be noted that databases, servers, and/or additional components may be utilized with, or integrated into, any type of network element coupled to the networks 104, 106, 108. In the context of the present description, a network element may refer to any component of a network.

According to some approaches, methods and systems described herein may be implemented with and/or on virtual systems and/or systems which emulate one or more other systems, such as a UNIX system which emulates a MAC OS environment, a UNIX system which virtually hosts a MICROSOFT WINDOWS environment, a MICROSOFT WINDOWS system which emulates a MAC OS environment, etc. This virtualization and/or emulation may be enhanced through the use of VMWARE software, in some embodiments.

In more approaches, one or more networks 104, 106, 108, may represent a cluster of systems commonly referred to as a "cloud." In cloud computing, shared resources, such as processing power, peripherals, software, data processing and/or storage, servers, etc., are provided to any system in the cloud, preferably in an on-demand relationship, thereby allowing access and distribution of services across many computing systems. Cloud computing typically involves an Internet or other high speed connection (e.g., 4G LTE, fiber optic, etc.) between the systems operating in the cloud, but other techniques of connecting the systems may also be used.

Figure 2:
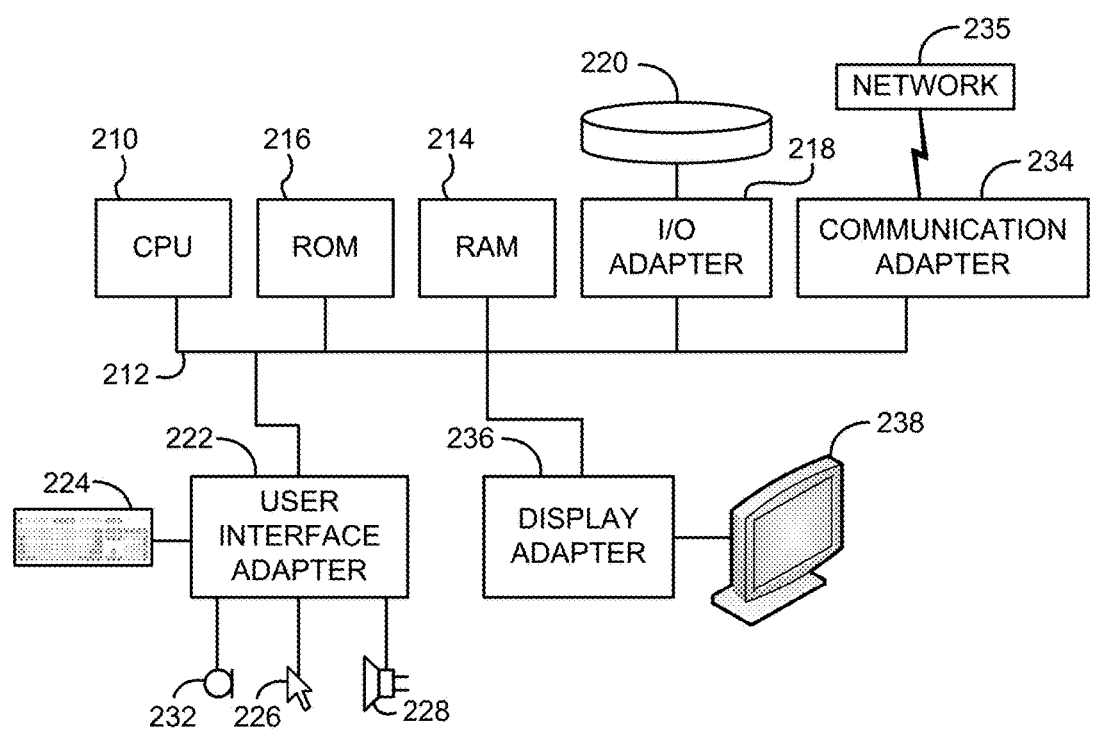
FIG. 2 shows a representative hardware environment that may be associated with the servers and/or clients of FIG. 1.

FIG. 2 shows a representative hardware environment associated with a user device 116 and/or server 114 of FIG. 1, in accordance with one embodiment. Such figure illustrates a typical hardware configuration of a workstation having a central processing unit 210, such as a microprocessor, and a number of other units interconnected via a system bus 212.

The workstation shown in FIG. 2 includes a Random Access Memory (RAM) 214, Read Only Memory (ROM) 216, an I/O adapter 218 for connecting peripheral devices such as disk storage units 220 to the bus 212, a user interface adapter 222 for connecting a keyboard 224, a mouse 226, a speaker 228, a microphone 232, and/or other user interface devices such as a touch screen and a digital camera (not shown) to the bus 212, communication adapter 234 for connecting the workstation to a communication network 235 (e.g., a data processing network) and a display adapter 236 for connecting the bus 212 to a display device 238.

The workstation may have resident thereon an operating system such as the Microsoft WINDOWS Operating System (OS), a MAC OS, a UNIX OS, etc. It will be appreciated that a preferred embodiment may also be implemented on platforms and operating systems other than those mentioned. A preferred embodiment may be written using JAVA, XML, C, and/or C++ language, or other programming languages, along with an object oriented programming methodology. Object oriented programming (OOP), which has become increasingly used to develop complex applications, may be used.

Card edge connector environments may become overcrowded due to the high density layouts of circuit boards to which the card edge connectors are coupled. This overcrowding may lead to overheating of the card edge connector environments, and furthermore, a lack of ease e.g. in terms of insertion angles, in terms of ease of accessibly, etc., when hot swapping cards in the card edge connectors. Embodiments described herein include orthogonal card edge connection layouts for maintaining a condensed and temperature-balanced card environment.

FIGS. 3A-3D depicts a connector 300 in accordance with one embodiment. As an option, the present connector 300 may be implemented in conjunction with features from any other embodiment listed herein, such as those described with reference to the other FIGS. Of course, however, such connector 300 and others presented herein may be used in various applications and/or in permutations which may or may not be specifically described in the illustrative embodiments listed herein. Further, the connector 300 presented herein may be used in any desired environment.

Various embodiments may include one or a plurality of connectors 300. Each connector 300 has a first end 314 having a plurality of first contacts 304 configured for coupling with a circuit board (embodiments with a circuit board shown in later FIGS.). The first contacts 304 may be copper and/or a conductive contact material of a type known in the art.

Each connector 300 additionally has a second end 316 oriented about orthogonal to the first end 314. The second end 316 may have a plurality of second contacts 308 configured for coupling directly with a card edge of an electronic device (embodiments with electronic devices shown in later FIGS.). Similar to the first contacts 304, the second contacts 308 may be copper, gold and/or a conductive contact material of a type known in the art.

Connector 300 also includes a plurality of leads (not shown) connecting the first contacts 304 to the second contacts 308. The leads connecting the first contacts 304 to the second contacts 308 may be copper, gold, aluminum, and/or a conductive contact material of a type known in the art. According to various embodiments, portions of all of the leads may extend along a common plane in connector 300, e.g., along a printed circuit board. Ensuring that the leads of connector 300 extend along a common plane may ensure that connector 300 remains spatially compact e.g. to increase component density, etc.

According to other embodiments, portions of some leads may extend along a common plane in connector 300, while portions of some of the leads may extend along uncommon planes in connector 300. According to yet other embodiments, portions of all of the leads may extend along uncommon planes in connector 300.

Connector 300 may further include at least one ground plane (not shown) extending generally parallel to the leads. The number of ground planes included in each connector 300 may vary depending on the preferred embodiment. Each of the one or more ground pins of the ground planes may be of a same and/or different design, e.g., shape, orientation therewith, etc., as the first contacts 304. Designing one or more ground pins of the ground planes to be substantially similar to the design of the first contacts 304 may advantageously ensure a spatially compact connector 300.

Figure 3A:
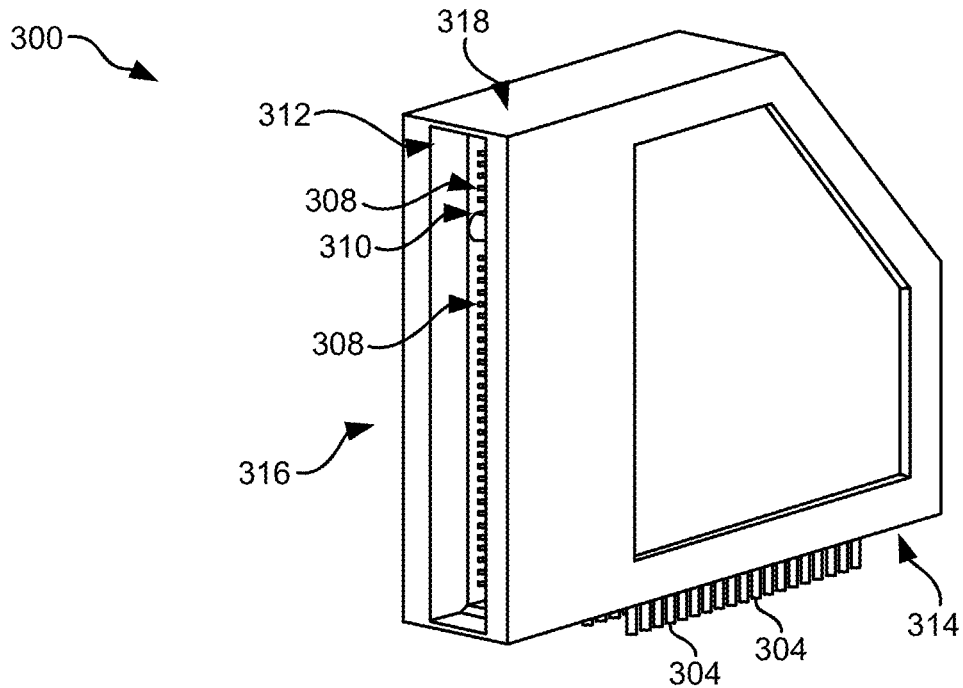
FIG. 3A is a perspective view of a connector, in accordance with one embodiment.

It should be noted that the plurality of leads connecting the first contacts 304 to the second contacts 308 are not readily visible in FIG. 3A because they reside on an inner portion of connector 300, e.g. that is enclosed by a housing 318, etc. The housing 318 may preferably be an injected molded plastic housing, but according to other embodiments may be e.g., a cast aluminum housing, a composite housing, of a conventional housing material of a type known in the art, etc. Furthermore the housing 318 may be configured in a way that prevents functionality problems in connector 300 e.g. electrical shorting, electrical isolation, system thermal irregularities, etc.

With continued reference to FIGS. 3A-3D, connector 300 may additionally include shielding, e.g., backplanes, reference planes for signal quality measures, etc., within the connector 300. Such shielding may furthermore extend into a circuit board (embodiments with a circuit board shown in later FIGS.) to which the connector 300 may be electrically coupled.

The second end 316 may also include an alignment feature 310 dividing the second contacts 308 into multiple arrays. The multiple arrays may divide contacts into the same and/or different size arrays of second contacts 308. Additionally, the multiple arrays may divide contacts of differing size and/or contact type e.g., in order to separate data contacts from power contacts, in order to separate differing data contact types, in order to establish an easier pairing of the second contacts 308 with a pairing contact, etc. For example, in connector 300 the alignment feature 310 divides the second contacts 308 into two separate arrays, each of which are of differing array sizes.

The alignment feature 310 may furthermore be configured to be received in a slot and/or indent of a card edge that is configured to be paired with the second end 316. For example, the alignment feature may be received in a slot and/or indent of a card edge that is paired with the second end 316, and may furthermore help to retain the card in the second end due to the alignment feature being substantially fit e.g. snuggly fit, abrasively fit, etc. within the slot and/or indent of a card edge.

According to other embodiments, the second end 316 may include a divider that divides the second contacts 308 into multiple identical arrays. In another embodiment, the divider may divide the second contacts 308 into multiple differing arrays. In yet another embodiment, the divider may divide the second contacts 308 into one or more differing arrays as well as one or more identical arrays.

In another embodiment, the alignment feature 310 may include one or more dividers (not shown) that separate the second contacts 308 into arrays each coupleable to a unique electronic device. The arrays separated by the one or more dividers may be of different and/or the same size. Furthermore, the one or more contacts of each array may differ in configuration and/or have identical contact configurations. In one exemplary approach, the connector may have two of the arrays of second contacts 308 like the array shown in FIG. 3A or another type, but stacked one atop the other, or side by side, for coupling with two unique electronic devices.

With continued reference to connector 300, the second end 316 includes an elongated slot 312 configured to receive the card edge of an electronic device. According to various embodiments, the elongated slot 312 may include an alignment portion, e.g., a partially angled portion which may assist in guiding the card edge of the electronic device as the card edge of the electronic device is inserted, an insertion guidance rail, e.g. as the second contacts are coupled directly with the card edge of an electronic device, etc., into the elongated slot 312, etc. Illustrative alignment portions are shown in FIG. 3B at the top and bottom of slot 312.

Figure 3B:
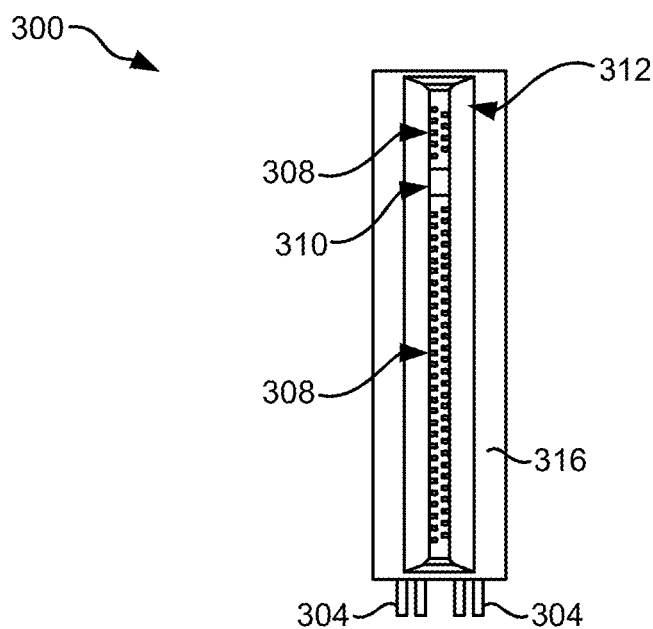
FIG. 3B is a front view of the connector of FIG. 3A, in accordance with one embodiment.

FIG. 3B is a front view of the connector 300. As shown in FIG. 3B, according to various embodiments the second contacts 308 may be positioned along both sides, e.g., the right side and left side, of the elongated slot 312. However, in other approaches, the second contacts 308 may be present along only a single side, or in any other arrangement as would become apparent to one skilled in the art upon reading the present disclosure. In further embodiments, the second contacts 308 may be pins, e.g., similar to the first contacts 304 shown in the FIG. 3A.

Figure 3C:
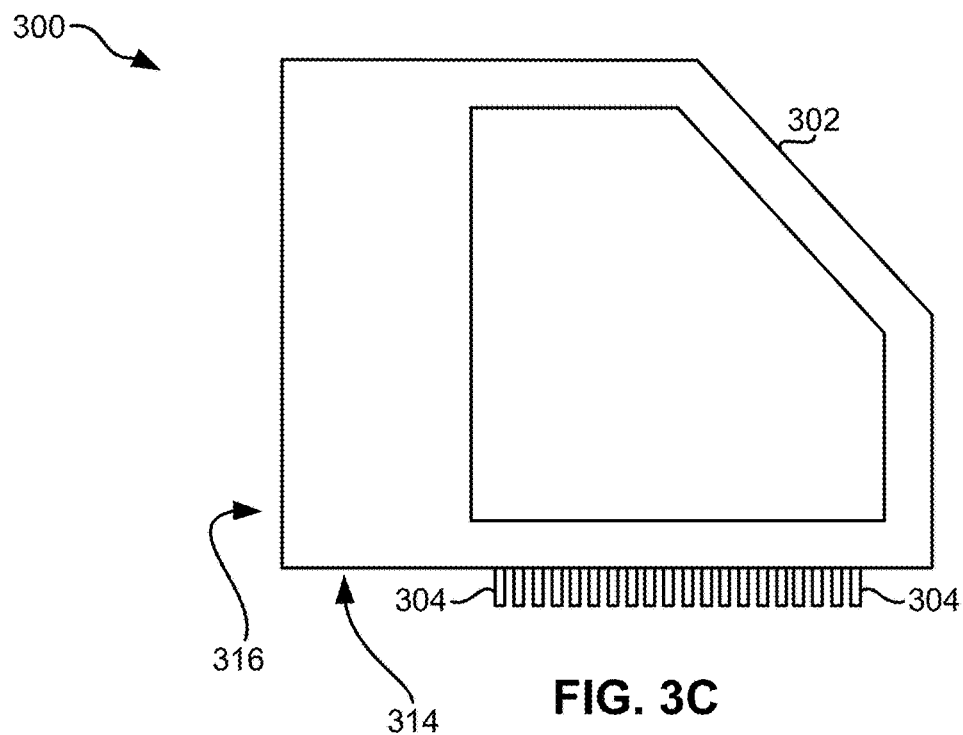
FIG. 3C is a side view of the connector of FIG. 3A-3B, in accordance with one embodiment.

FIG. 3C is a side view of the connector 300.

Figure 3D:
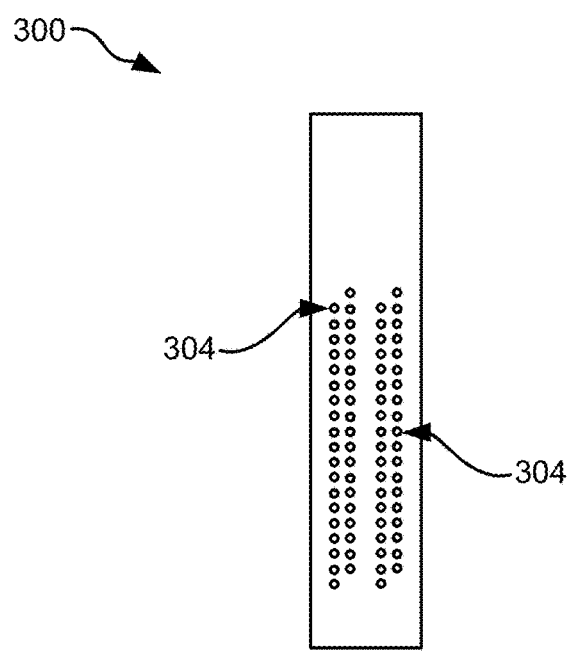
FIG. 3D is a bottom view of the connector of FIG. 3A-3C, in accordance with one embodiment.

FIG. 3D is a bottom view of the connector 300. The first contacts 304 of the first end 314 are configured in two separate side by side arrays which may include signal and/or ground contacts. The configuration of the first contacts 304 of the first end 314 may furthermore vary depending on the spatial parameters of a component the connector 300 may be electrically coupled to, e.g., a circuit board, an option board, etc., via contacts 304. Moreover, the first contacts 304 may be present in a slot, e.g., similar to slot 312.

In a preferred embodiment, the connector has an aspect ratio of at least 1:2 (width:height), more preferably at least 1:4, as measured along the first end, e.g., as shown in FIG. 3B and/or the second end, e.g., as shown in FIG. 3D.

Figure 4A:
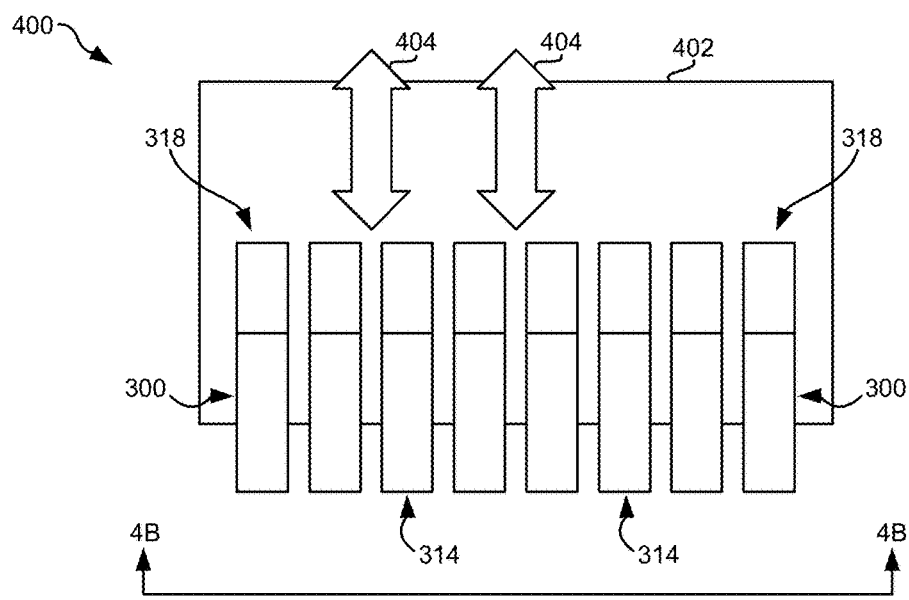
FIG. 4A is a top view of connectors and a circuit board, in accordance with one embodiment.
Figure 4B:
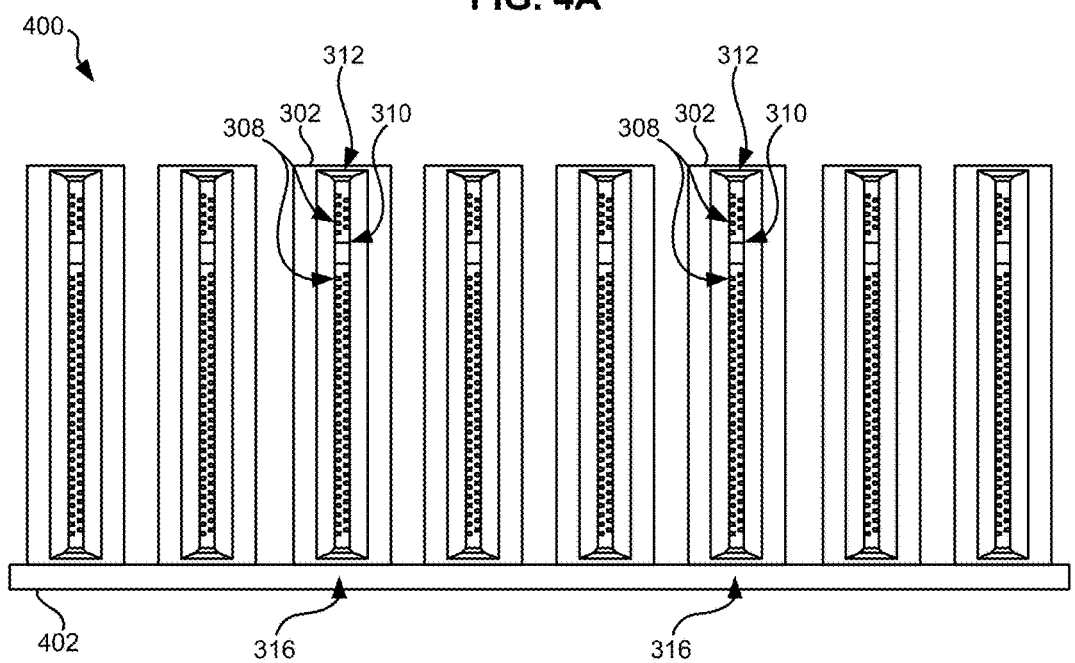
FIG. 4B is an enlarged, detailed side view of the connectors and the circuit board of FIG. 4A taken along line 4B-4B, in accordance with one embodiment.
Figure 4C:
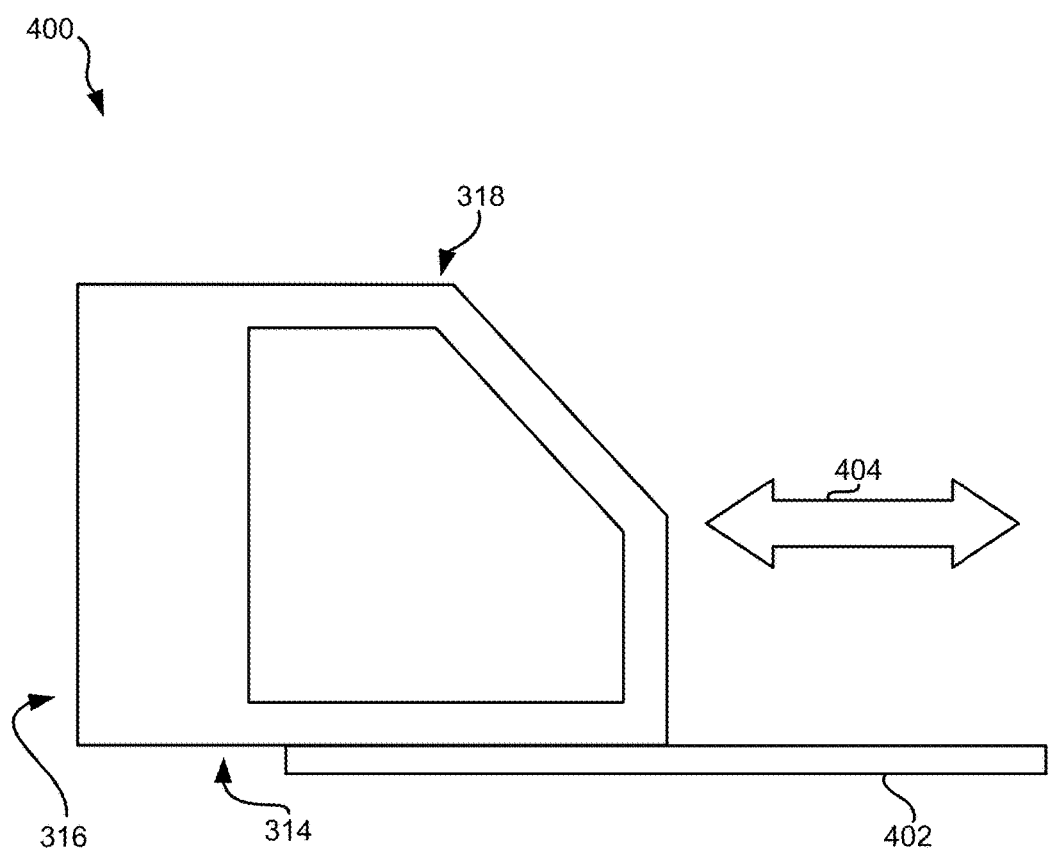
FIG. 4C is a side view of the connectors and the circuit board of FIG. 4A-4B, in accordance with one embodiment.

FIGS. 4A-4C depicts a system 400 in accordance with one embodiment. As an option, the present system 400 may be implemented in conjunction with features from any other embodiment listed herein, such as those described with reference to the other FIGS. Of course, however, such system 400 and others presented herein may be used in various applications and/or in permutations which may or may not be specifically described in the illustrative embodiments listed herein. Further, the system 400 presented herein may be used in any desired environment.

System 400 includes a plurality of connectors 300. As previously described, various embodiments described herein may include one or a plurality of connectors 300 depending on the preferred embodiment, e.g., two connectors 300, eight connectors 300 in system 400 for purposes of this example, twelve connectors 300, etc. In preferred approaches, system 400 may include a preferred range of 2-12 connectors 300, but may vary depending on the preferred embodiment.

System 400 also includes a circuit board 402. According to various embodiments, the circuit board 402 may be a motherboard, mainboard, backplane circuit board, printed circuit board (PCB), etc.

According to other embodiments, the circuit board 402 may be an option board cabled to a motherboard.

The circuit board 402 may further include conventional features, e.g. circuits, chips, etc., and in some cases having specialized contact arrays for coupling to the first contacts 304 of the connectors 300.

As previously described, the first end 314 of a connector 300 has a plurality of first contacts 304 coupled to the circuit board 402, e.g., in a way that affixes the connector 300 to the circuit board 402, thereby establishing an electrical connection between the connector 300 and the circuit board 402, etc.

Various embodiments of coupling the first contacts 304 to the circuit board 402 will now be described below for purposes of an example. Further coupling embodiments may be alternatively and/or additionally used to couple one or more connectors 300 and the circuit board 402.

According to various embodiments, the first contacts 304 may be coupled to the circuit board 402 by a solder tail coupling e.g. as shown in system 400, etc. Solder tail coupling may be established between the first contacts 304 and the circuit board 402 by soldering, e.g., wave soldering, a soldering of a type known in the art, etc., the first contacts 304 of connector 300 to drilled through holes in the circuit board 402.

According to further embodiments, the first contacts 304 may be coupled to the circuit board 402 by a press fit coupling. Press fit coupling may be established between the first contacts 304 and the circuit board 402 by pressing oversized first contacts 304 of the first end 314 partially and/or fully into plated holes in the circuit board 402. Press fit coupling may advantageously establish a reliable connection between the connector 300 and the circuit board 402, e.g., by the press fitting establishing an air tight seal between the connector 300 and the circuit board 402, by using an oversized first contact that by design compresses as it is inserted into a plated hole of the circuit board 402, etc. It should be noted that the press fit coupling described herein may or may not additionally include a soldering between the oversized first contacts 304 of the first end 314 and the plated holes in the circuit board 402. Press fit coupling may furthermore eliminate reflection stub that otherwise may reduce signal integrity or signal quality established by the coupling.

According to yet further embodiments, the first contacts 304 may be coupled to the circuit board 402 by a surface mount coupling (hereafter referred to as "SMT"). According to various embodiments, SMT coupling may be established between the first contacts 304 and the circuit board 402 by pressing first contacts 304 into surface pads on circuit board 402. The surface pads may include solder paste which may then may then couple the first contacts 304 with the circuit board 402 once the solder paste is melted e.g. via infrared reflow, via a heating of the solder paste, via a soldering type known in the art, etc. The first contacts 304 may furthermore be "L" shaped in order to establish an orthogonal coupling between the second contacts 308 and the first contacts 304 (the first contacts 304 being coupled with the circuit board 402 at the surface pads, etc.). SMT coupling may provide stronger signal integrity and/or performance, and therefore may be preferred.

According to one embodiment, the connectors 300 may be coupled to the circuit board 402 on a recessed/lowered portion (not shown) of the circuit board 402, so that the connector profile on the circuit board 402 is low profile and/or flush with the surface of the circuit board 402 to which the connector 300 is coupled.

It should be noted that in embodiments which include more than one connector 300 being coupled to the circuit board 402, the type of coupling may vary depending on the preferred embodiment. Alternatively in embodiments which include more than one connector 300 being coupled to the circuit board 402, the type of coupling may be the same.

With continued reference to FIG. 4A, system 400 further may include a fan (not shown) for inducing air flow across the connectors 300 in a direction 404 parallel to the first end

314. The connectors 300 may furthermore be spaced apart from one another in a direction orthogonal to direction 404 to promote cooling of system 400, e.g., in order to cool system 400 from heat that may be generated during system 400 function, in order to prevent asperities (e.g. dust, etc.) from building up in system 400, etc. For example, closest facing portions of at least some of the connectors may be spaced apart by a distance sufficient to allow substantially uninhibited airflow therebetween in a direction parallel to the first end, e.g., the airflow between the adjacent connectors is volumetrically reduced by less than 20%. Inducing air flow across the connectors 300 in a direction 404 parallel to the first end 314 may not otherwise be possible and/or as efficient in conventional card edge connection layouts with condensed vertical backplane connections.

FIG. 4B is a detailed side view of system 400 of FIG. 4A taken along line 4B-4B. It should be noted that the connectors 300 of FIG. 4B are illustrated as being larger in size than the connectors 300 were in FIG. 4A for the purposes of showing detail of the second end 316. It should be further noted that the spatial configurations, e.g., the spacing between each of the connectors 300, the spacing between the outermost connectors and the edge of the circuit board 402, etc., of connectors 300 may vary depending on the preferred embodiment.

FIG. 4C is a detailed side view of system 400 of FIG. 4A-4B. It should be noted that the spatial configurations, e.g., the portion of connectors 300 residing past the outermost edge of the circuit board 402, the spacing between the connectors 300 and the edge of the circuit board 402, etc., of connectors 300 may vary, e.g., connectors 300 may alternatively be positioned flush with the outermost edge of the circuit board 402, etc., depending on the preferred embodiment.

Figure 5A:
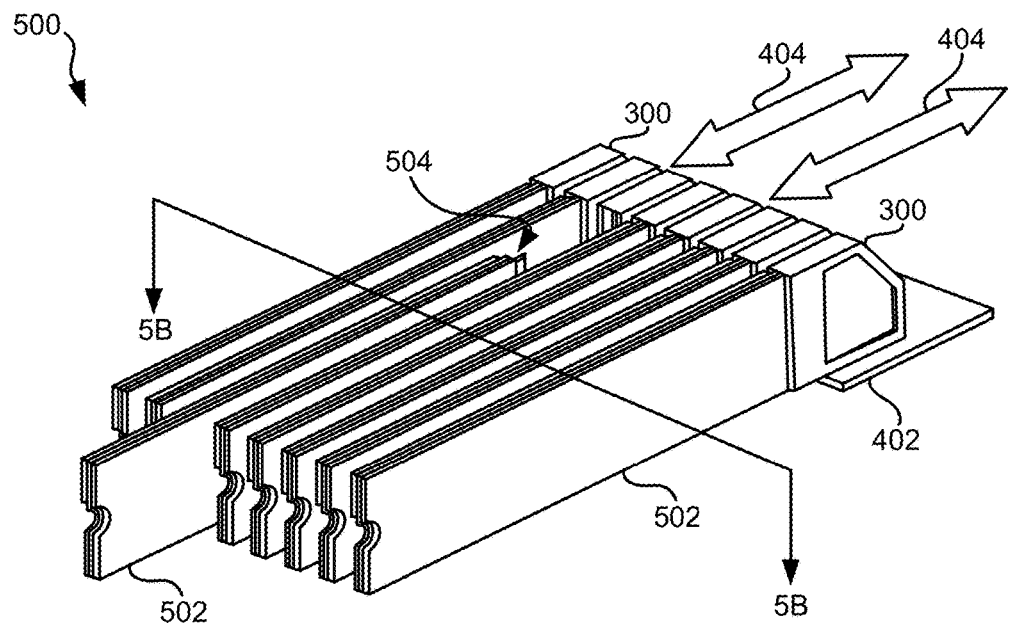
FIG. 5A is a perspective view of electronic devices attached to connectors and a circuit board, in accordance with one embodiment.
Figure 5B:
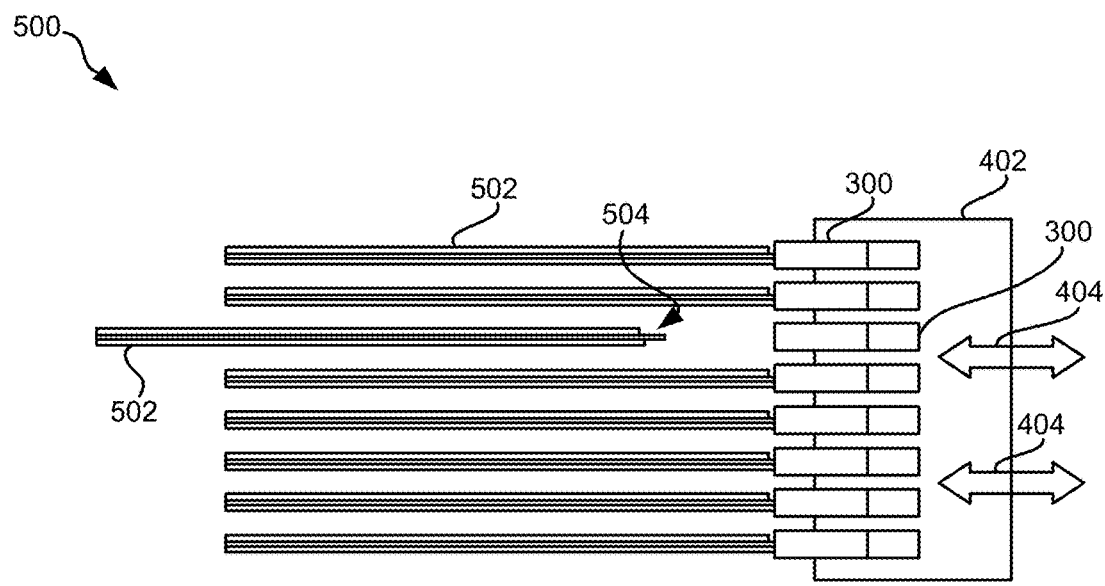
FIG. 5B is a top view of the electronic devices attached to the connectors and the circuit board of FIG. 5A taken along line 5B-5B, in accordance with one embodiment.

FIGS. 5A-5B depicts a system 500 in accordance with one embodiment. As an option, the present system 500 may be implemented in conjunction with features from any other embodiment listed herein, such as those described with reference to the other FIGS. Of course, however, such system 500 and others presented herein may be used in various applications and/or in permutations which may or may not be specifically described in the illustrative embodiments listed herein. Further, the system 500 presented herein may be used in any desired environment.

FIG. 5A is perspective view of the system 500. System 500 includes connectors 300 and circuit board 402. System 500 further includes a plurality of electronic devices 502 each having a card edge 504 coupled to the second end 316 of a respective one of the connectors 300. The electronic devices 502 may be any type of electronic devices, e.g., such as memory cards, data processing cards, electronic devices of a type known in the art, etc. Furthermore, each of the electronic devices 502 of system 500 may differ from one another, e.g., differ in size, differ in functionality, differ in how each card is coupled to the second end 316 of a respective one of the connectors 300, etc. depending on the embodiment.

It should be noted that connectors 300 in system 500 are illustrated as being coupled to a single corresponding electronic device 502. In other embodiments, more than one electronic device 502 may be coupled to one or more of the connectors 300, e.g., when the connectors are designed accordingly, when the circuit board is designed to accept such a connector, etc.

The coupling between each of the card edges 504 of the plurality of electronic devices 502 and the respective connectors 300 may be uncoupled by various actions. For example, the coupling between each of the card edges 504 of the plurality of electronic devices 502 and the respective connectors 300 may be uncoupled. e.g., by a user and/or accessor pulling out the electronic device 502 in a direction substantially similar to a direction in which the electronic devices 502 are inserted for coupling with the first contacts 304.

As previously described in system 400, system 500 further may include a fan (not shown) for inducing air flow across the connectors 300 in a direction 404. The connectors 300 and/or the electronic devices 502 may furthermore be spaced apart from one another in a direction orthogonal to direction 404 to promote cooling of system 500, e.g., in order to cool system 500 from heat that may be generated during system 500 operation, in order to prevent asperities (e.g. dust, etc.) from building up in system 500, etc.

Orthogonal card edge connection layouts described herein may maintain the density of a card to board connection when the pitch between the cards is increased for cooling purposes. For example, when implemented in one or more spinning drive bays of a computer, this maintained density may be especially appealing to consumer spatial demands. This benefit may be not possible in conventional card edge connection layouts, e.g., vertical card edge connection layouts, etc.

FIG. 5B is a top down view of the electronic devices 502 attached to the connectors 300 and the circuit board 402 of FIG. 5A taken along line 5B-5B.

It should be noted that system 500 includes a plurality of eight connectors 300 with eight corresponding electronic devices for example purposes. Further embodiments may include more or fewer connectors 300 and/or electronic devices 502 of varying configurations. For example in a further embodiment, a circuit board may include sixteen connectors 300 with only ten of the connectors 300 coupled to a corresponding electronic device 502, e.g., where the remaining six uncoupled connectors 300 may later be filled by a user when more flash memory is desired, where the six uncoupled connectors and the ten coupled connectors are staggered to provide more spatial spreading between the connectors to further promote the cooling of system 500, etc.

The inventive concepts disclosed herein have been presented by way of example to illustrate the myriad features thereof in a plurality of illustrative scenarios, embodiments, and/or implementations. It should be appreciated that the concepts generally disclosed are to be considered as modular, and may be implemented in any combination, permutation, or synthesis thereof. In addition, any modification, alteration, or equivalent of the presently disclosed features, functions, and concepts that would be appreciated by a person having ordinary skill in the art upon reading the instant descriptions should also be considered within the scope of this disclosure.

While various embodiments have been described above, it should be understood that they have been presented by way of example only, and not limitation. Thus, the breadth and scope of an embodiment of the present invention should not be limited by any of the above-described exemplary embodiments, but should be defined only in accordance with the following claims and their equivalents.

What is claimed is:

1. A system, comprising:
    a first end having a plurality of first contacts configured for coupling with a circuit board;
    a second end oriented about orthogonal to the first end, the second end having a plurality of second contacts configured for coupling directly with a card edge of an electronic device, the orientation of the second end relative to the first end being fixed; and a plurality of leads connecting the first contacts to the second contacts, wherein the second end has an alignment feature dividing the second contacts into multiple arrays, wherein the leads lie along a first plane, wherein two of the multiple arrays lie on opposite sides of a second plane that intersects the first plane orthogonally.

2. The system as recited in claim 1, wherein the second contacts are female contacts.

3. The system as recited in claim 1, wherein portions of all of the leads extend along a common plane, wherein a profile pattern of at least one array of the second contacts matches a profile pattern of at least one array of the first contacts.

4. The system as recited in claim 1, wherein the second end includes an elongated slot configured to receive the card edge of the electronic device.

5. The system as recited in claim 4, wherein the second contacts are positioned along both sides of the elongated slot.

6. The system as recited in claim 1, wherein the first end has a same physical shape as the card edge of the electronic device.

7. The system as recited in claim 1, wherein the system has an aspect ratio of at least 1:2.

8. A system, comprising:
a circuit board;
a plurality of connectors, each connector having:
    a first end having a plurality of first contacts coupled to the circuit board;
    a second end oriented about orthogonal to the first end, the second end having a plurality of second contacts configured for coupling directly with a card edge of an electronic device, the orientation of the second end relative to the first end being fixed; and
    a plurality of leads connecting the first contacts to the second contacts,
    wherein the second end has an alignment feature dividing the second contacts into multiple arrays,
    wherein the leads lie along a first plane,
    wherein the multiple arrays lie on opposite sides of a second plane that intersects the first plane orthogonally.

9. The system as recited in claim 8, wherein the second contacts are female contacts.

10. The system as recited in claim 8, wherein portions of all of the leads extend along a common plane, wherein a profile pattern at least one array of the second contacts matches a profile pattern of at least one array of the first contacts.

11. The system as recited in claim 8, wherein the second end includes an elongated slot configured to receive the card edge of the electronic device.

12. The system as recited in claim 11, wherein the second contacts are positioned along both sides of the elongated slot,
    wherein a profile pattern of at least one array of the second contacts positioned along both sides of the elongated slot match a profile pattern of at least one array of the first contacts,
    where the first contacts are configured to couple directly with the circuit board via a card edge connection,
    wherein each connector has an aspect ratio of at least 1:2;
    and further comprising a fan for inducing air flow across the connectors in a direction parallel to the first end.

13. The system as recited in claim 8, wherein the first end has a same physical shape as the card edge of the electronic device.

14. The system as recited in claim 8, wherein the circuit board is a motherboard.

15. The system as recited in claim 8, wherein the circuit board is an option board.

16. The system as recited in claim 8, comprising a plurality of electronic devices each having a card edge coupled to the second end of a respective one of the connectors.

17. The system as recited in claim 8, comprising a fan for inducing air flow across the connectors in a direction parallel to the first end.

18. The system as recited in claim 8, wherein closest facing portions of at least some of the connectors are spaced apart by a distance sufficient to allow substantially uninhibited airflow therebetween in a direction parallel to the first end.

* * * * *